United States Patent [19]

Magarshack

[11] Patent Number: 5,012,321
[45] Date of Patent: Apr. 30, 1991

[54] INTERCONNECTION DEVICE BETWEEN THE CELLS OF A PRE-IMPLANTED HYPERFREQUENCY INTEGRATED CIRCUIT

[75] Inventor: John Magarshack, Rueil Malmaison, France

[73] Assignee: Thomson-CSF, Paris, France

[21] Appl. No.: 634,435

[22] Filed: Jul. 26, 1984

[30] Foreign Application Priority Data

Jul. 29, 1983 [FR] France .................. 83 12540

[51] Int. Cl.$^5$ .................... H01L 27/095
[52] U.S. Cl. .................... 357/71; 357/51; 357/45; 333/247
[58] Field of Search .............. 357/51, 71, 45; 330/286; 333/246, 247

[56] References Cited

U.S. PATENT DOCUMENTS

| | | | |
|---|---|---|---|
| 4,190,854 | 2/1980 | Redfern | 357/51 |
| 4,291,326 | 9/1981 | Higuchi et al. | 357/51 |
| 4,418,470 | 12/1983 | Naster et al. | 357/51 |
| 4,458,215 | 7/1984 | Huang et al. | 357/51 |
| 4,504,796 | 3/1985 | Igarashi | 330/286 |
| 4,525,732 | 6/1985 | Bayraktaraglu | 357/51 |
| 4,527,180 | 7/1985 | Oto | 357/51 |
| 4,543,535 | 9/1985 | Ayasli | 330/286 |

FOREIGN PATENT DOCUMENTS 0070104 1/1983 European Pat. Off. .
2087183 5/1982 United Kingdom .

OTHER PUBLICATIONS

Rode et al., IEEE, 1983, GaAsIC Symposium, pp. 178–181.
Toyoda et al., Japan J. Appl. Phys. Suppl. 22-1, 1983, pp. 345–348.

Primary Examiner—William D. Larkins
Attorney, Agent, or Firm—Oblon, Spivak, McClelland, Maier & Neustadt

[57] ABSTRACT

The invention concerns pre-implanted circuits in a rapid semiconductor such as GaAs, comprising a network of cells formed of active and passive components. The cells are supplied but are not interconnected between one another. The interconnection between the cells is made by capacitive or magnetic coupling between two metallization levels separated by an insulating layer. Between a component of a first cell and a component of a second cell, both pre-implanted in a substrate, the interconnection made by means of microstrips supported by the substrate and in ohmic contact with the said components and microstrips supported by an insulating layer, microstrips and insulator forming capacities in the zones where there is covering.

10 Claims, 2 Drawing Sheets

INTERCONNECTION DEVICE BETWEEN THE CELLS OF A PRE-IMPLANTED HYPERFREQUENCY INTEGRATED CIRCUIT

BACKGROUND OF THE INVENTION

1. Field of the invention

The present invention concerns an interconnection device between the hyperfrequency monolithic circuit cells preimplanted in a substrate made of rapid-semiconductor materials, such as GaAs. This interconnection device permits, through its structure, to transform any network of active and passive components, previously manufactured on plate substrates made of semiconductor material, then stored, in specific circuits corresponding to particular electrical diagrams, while taking into account the requirements inherent in the hyperfrequency electrical links, such as the length of the links and the impedance provided by these links.

DISCUSSION OF BACKGROUND

Pre-diffused circuits are well known, when they are realized on materials such as silicon. They are integrated circuits grouping together on a single chip or semiconductor patch, a great number of elementary cells such as networks of transistors, linear amplifiers, logic gates ... etc. Of course, different types of pre-diffused integrated circuits exist according to whether the circuits to be realized constitute for example linear or logic electronics or power electronics. Each cell or function, such as a gate, is complete and in an energized condition, but its input-output connections with other cells are not realized; they are limited to metallic contact pieces on the surface of the chip, and the specific interconnections, between cells, to obtain a well designed electronic circuit are realized by a network of metallic conductors, by means of one or several specific masks. Taking into account the frequencies of normal operations with silicon, the length or the form of the interconnection metallizations does not give rise to any problems, and the interconnection of the cells is essentially limited by the necessity of having only few conductor crossings, these crossings requiring an insulating layer between two conductors. Furthermore, the chips of the integrated circuits pre-diffused on silicon can be stored, the metallic contact pieces being available for the final metallization which allows to realize the conductor network.

However, this is not the case of the hyperfrequency pre-implanted integrated circuits, i.e. those which operate far beyond 1 GHz, towards 8 to 10 GHz, for example, and which are, in fact, realized in materials such as GaAs or InP, for example, materials which are in no way limited. In this case, reference is preferably made to pre-implanted circuits since the doping in impurities in the base material is no longer carried out by diffusion, but is instead preferably made by implantation.

In hyperfrequency integrated circuits, the links between the components must take into account the impedances and the capacities provided by the links themselves, and they are generally effected by microstrips, which means that it is necessary to take into account their length, often bound to $\lambda/4$, $\lambda$ being the wavelength at the operating frequency, so that links are tuned It is therefore not possible, as in the case of a pre-diffused circuit on silicon to group together, for example, two transistors that have already been implanted in the plate substrate by any metallic conductor strip. Furthermore, it is preferable to maintain pre-implanted circuits on GaAs with a surface protection, thereby excluding maintaining ohmic contacts through metallizations or at least rendering it difficult to locate these metallizations by piercing the insulating layer that covers the GaAs chip.

The interconnection of the cells of a hyperfrequency pre-implanted integrated circuit thus presents two difficulties: on one hand, it is not sufficient to have one metallic link having any form and impedance and on the other hand, there is preferably on the surface of the pre-implanted integrated circuit an insulating protection layer.

SUMMARY OF THE INVENTION

The interconnection device according to the invention uses specifically the insulating layer deposited on the surface of a pre-implanted circuit as a means for the formation of linking capacitances or transformers, for the magnetic or capacitive coupling between a first metallization layer that forms part of the pre-implanted circuit, and a second metallization layer that constitutes the interconnections between the cells of the pre-implanted circuit, this second metallization layer being supported by the insulating protection layer.

More specifically, the invention concerns an interconnection device between the cells of a hyperfrequency integrated circuit pre-implanted in a semiconductor material, the cells being formed of active and passive components which comprise metallizations on the upper surface of the chip made of semiconductor material, this interconnection device being characterized in that the coupling between one component of a first cell and a component of a second cell is capacitive or magnetic, and that the device is realized by:

at least one microstrip in ohmic contact with a metallization of the first component and at least one microstrip in ohmic contact with a metallization of the second component, the said microstrips being supported by the upper surface of the semiconductor material;

at least one insulating layer, deposited on the upper surface of the semiconductor material and the microstrips supported thereon;

at least one microstrip supported by the insulating layer, the said microstrip partially covering the microstrips supported by the semiconductor material in order to form a capacitive link.

BRIEF DESCRIPTION OF THE DRAWINGS

The invention will be better understood by reading through the following description given, in further detail with reference to the annexed drawings which represent.

DETAILED DESCRIPTION OF THE PREFERRED EMBODIMENT

Figure 1:
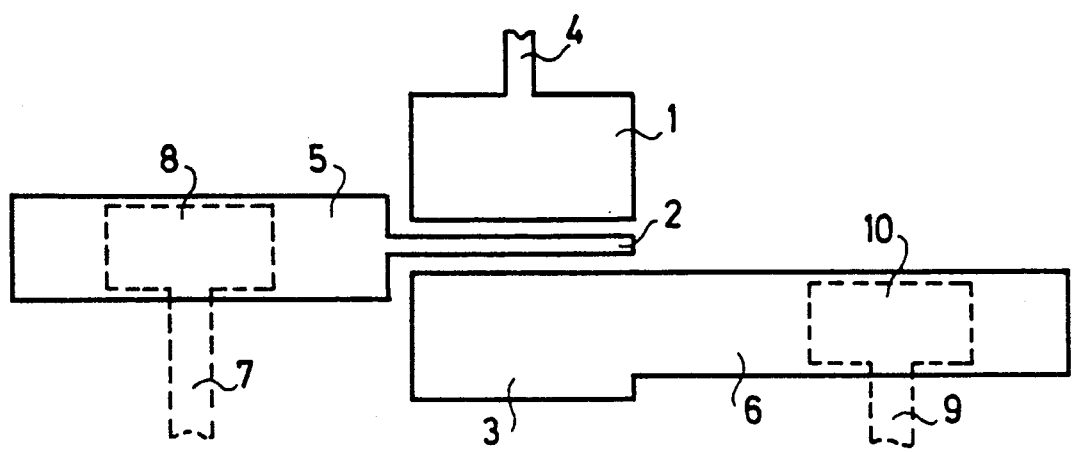
FIG. 1: plane view of a field effect transistor, forming part of a pre-implanted cell, and showing interconnection means between the circuits.

The monolithic integrated circuits operating in hyperfrequencies are essentially realized on substrates made of GaAs or Group III-V (of the Periodic Classification) materials. In such integrated the active elements are field effect transistors and the passive elements are diodes, resistances, inductances, capacitances and transmission lines.

Pre-implanted circuits are realized that group together the cells, each of which constitutes an elementary function, the assembly of the cells forming a network but the cells not yet being interconnected. The functions realized from the active and passive elements cited can be amplifiers, commutators or complete receiving heads, for example. The realization of such pre-implanted circuits passes through several steps:
realization of the active elements, transistors and diodes;
realization of the passive elements, resistances and capacitances;
realization of the inductances, transmission lines and interconnections;
realization of the input-output contacts and thickening of the metallizations.

The first step is the most critical step because the realization of small-size high quality transistors, having a gate length of about 1 micron, with good ohmic contacts on a material such as GaAs, is a very delicate operation. It is therefore interesting to produce pre-implanted integrated circuits that propose plate substrates in which are already realized the elements the most difficult to realize, i.e. transistors. The pre-implanted circuits thus present the following advantages:
the most difficult steps are previously realized and the plate substrates are stored and already tested;
the operator can easily define the functions from a library of cells implanted on the integrated circuit, by adding the interconnections that transform any network of cells into a clearly specific circuit;
the conception time is shortened since the integration of the cells in the substrate of the integrated circuit has been studied and realized previously: conception time has thus been brought to the conception time of the interconnections;
the realization time is also shortened since the implantation operations are already carried out and it only remains to interconnect the cells at the surface.

With pre-diffused integrated circuits on silicon, i.e. those operating at low frequency, the only currently known technique consists in realizing the interconnection between two cells by means of metallic lines engraved on one or two levels, between the metallic contact pieces that are reached from the level of the engraved metallic lines by means of holes formed in the dielectrics that covers the chip.

With the pre-implanted integrated circuits on GaAs or family III-V materials, it is not desirable to use this method for interconnecting the hyperfrequency cells.

Indeed, the electrical length of the interconnections is very important in hyperfrequencies which severely limits the site between the elements of the cells. By way of example, $\lambda/4$ at 10 GHz, is equal to 2 mm, $\lambda$ being the wavelength at this frequency.

The values of the impedances brought by the interconnections must be adopted with the tuning components according to a specification imposed by the operating of the circuit. Generally, these elements are calculated by an optimization program prior to the implantation of the components of the cells.

Furthermore, the interconnections must remain as short as possible in order to prevent any losses and interference resonances.

The invention proposes to overcome the inter connection difficulties for the hyperfrequency integrated circuits by providing a coupling between the level of the metallizations of the active elements, pre-implanted in the substrate of the integrated circuit, and the level of the interconnection metallizations, deposited as required on the outside surface of the insulating layer that covers the pre-implanted circuit, this coupling being made in a capacitive or magnetic manner, but not in an electric manner from the direct current angle, i.e. without ohmic contact or piercing of the insulating layer.

Figure 2:
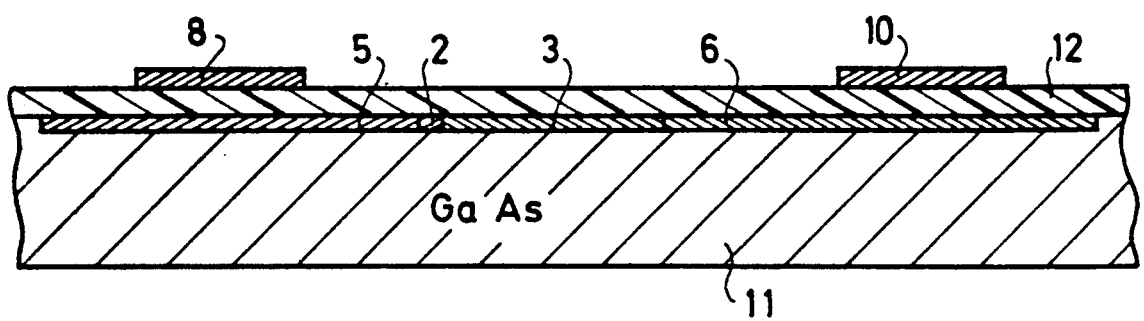
FIG. 2: section view of the transistor of the preceding figure, showing the interconnection device in elevation.

FIGS. 1 and 2, provide a better understanding of the coupling device.

FIG. 1 represents a planar view of an active element of a pre-implanted cell, for example, a field effect transistor. Only the metallizations of this transistor are represented, the substrate and the different active layers being behind the plane of the figure. This transistor thus comprises a metallization of source 1, a metallization of gate 2 and a metallization of drain 3. The metallization of source 1 is polarized through the intermediary of a metallization 4 that is present in the same plane as the metallizations of the transistor. But the metallizations of gate 2 and drain 3 are extended, always in this same plane, by microstrips that are respectively the microstrips 5 for the gate 2 and the microstrip 6 for the drain 3. These microstrips consequently have a length and a width defined by the hyperfrequency laws, i.e. they are as long as possible but smaller than or equal to $\lambda/4$, $\lambda$ being the operating frequency. It is of interest that the microstrips be as long as possible since this facilitates the interconnections with the adjacent cells.

Above the metallization of the first level, is deposited an insulating layer 12, which is not shown in FIG. 1 but which is very clear in FIG. 2, which shows again in section the field effect transistor of the previous figure.

The interconnections with the adjacent cells are realized by means of other microstrips, deposited above the insulating layer 12, the microstrips of this second level crossing the microstrips 5 and 6 of the first level.

The trace of the microstrip 7 which ensures the interconnection with the gate 2 of the transistor, and the trace of a microstrip 9 that ensures the interconnection with the drain of the transistor have thus been represented in broken lines since they are not in the plane of the figure. These microstrips cover part of the microstrips 5 and 6 of the first level by surfaces 8 for the microstrip of gate 7, and 10 for the microstrip of drain 9, the surfaces 8 and 10 corresponding to the necessary adaptation discussed herein-above. The area of the metallization 8 determines with the microstrip 5 and the insulator 12 a capacity having a clearly defined value. In the same way, the microstrip 10 defines with the microstrip 6 and the insulator 12 another capacity also having a well defined value.

FIG. 2 completes FIG. 1 to the extent that it shows body 11 of semiconductor material, this body comprising the substrate and the different epitaxied layers, active layers, buffer layers . . . etc. which have not been represented in this figure since their detail departs from the field of the invention. On the semiconductor material 11 is deposited a first metallization level and FIG. 2 shows part of the metallization of gate 2 and its microstrip 5, as well as the metallization of drain 3 and its microstrip 6. The metallizations of source, gate, drain and microstrips constitute the first level; the second level is constituted by interconnection metallizations 8 and 10 that are separated from the first level by the insulating layer 12.

Therefore, no holes are realized in the insulating layer and there is no ohmic contact, with or without holes. The coupling is carried out in the present case by a capacitive effect; it can also be carried out by a magnetic effect by bringing together two conductors or microstrips, for example, which, furthermore, are not necessarily cut at right angles, as shown in the figures.

Figure 3:
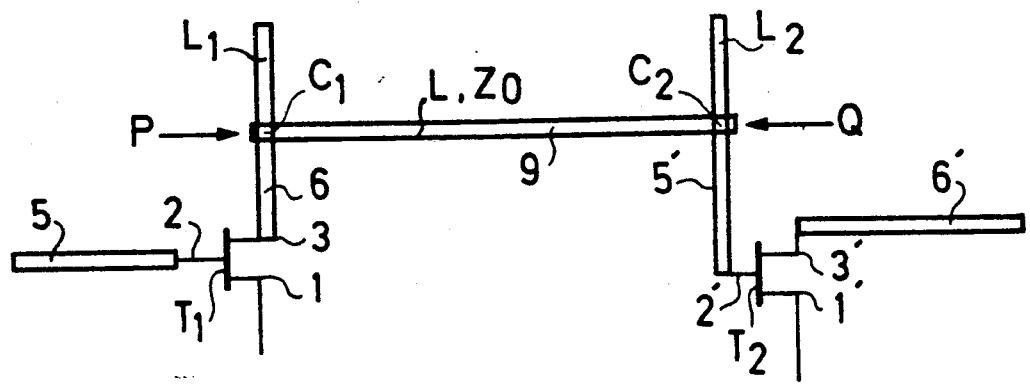
FIG. 3: principle diagram of the hyperfrequency interconnection between two pre-implanted cells.

The operating of this interconnection device will be better understood from FIG. 3.

FIG. 3 presents the example of the coupling between a first transistor $T_1$ belonging to a first cell of the pre-implanted circuit and a second transistor $T_2$ belonging to a second cell of the same pre-implanted circuit. The transistor $T_1$ possesses, for example, a source 1, a gate 2 and a drain 3 as represented in FIG. 1: the gate 2 is provided with a microstrip 5 and the drain 3 is provided with a microstrip 6. The transistor $T_2$ possesses the same elements of source 1', gate 2' and drain 3' and is also provided with microstrips of gate 5' and drain 6'.

The couplings between these two implanted transistors in the semiconductor material is carried out in a capacitive manner through the intermediary of microstrips 6 of the drain transistor $T_2$. These two microstrips are joined together by a microstrip 9 located in the second level of metallization, i.e. deposited on the insulating layer 12 that covers the pre-implanted circuit. Of course, the example given of a connection between a drain and a gate is in no way limitative of the invention: the interconnection can be made between microstrips in ohmic contact with any active or passive component.

In hyperfrequencies, a small capacity represents a fairly strong coupling and its use allows to improve conception flexibility. It is the capacity $C_1$ formed between the drain microstrip 6 of transistor $T_1$ and the interconnection microstrip 9 which allows to ensure a capacitive connection. In the same way, a capacity $C_2$ is formed between the gate microstrip 5' of the transistor $T_2$ and the interconnection microstrip 9.

The drain microstrip of transistor $T_1$ having a transmission line $L_1$, the microstrip 5' of the transistor $T_2$ having a transmission line $T_2$, and L and $Z_0$ being the electric length and impedance of the interconnection microstrip 9, the tuning and interconnection elements in the device according to the invention are $L_1$ and $C_1$, $L_2$ and $C_2$, L and $Z_0$ of the interconnection line. The four values $C_1$, $C_2$, L and $Z_0$ can be independently controlled at the last interconnection level, as well as values $L_1$ and $L_2$, at the first interconnection level that is protected by the insulating layer 12; $L_1$ and $L_2$ being realized under an insulating layer, it is no longer possible to intervene on their characteristic impedances but the lengths $L_1$ and $L_2$ can be chosen with the position of the points P and Q.

The characteristics of the interconnection are thus obtained by acting:

in the first place on the position of the points P and Q that represent respectively the crossing site of the interconnection microstrip 9 with the microstrip 6 of the first cell and with the microstrip 5' of the second cell. The useful distance from the drain 3 of the first transistor $T_1$ to the point P where the capacitor $C_1$ is formed is adjustable, as well as the useful distance of the microstrip 5' between the gate 2' and the point Q where the capacitor $C_2$ is formed;

in the second place, on the length of the microstrip 9: if the microstrip 9 must be long, it is always possible to bend it so that it finds its geometric position between two microstrips of the first level. If a microstrip 9 must be short with respect to the distance separating two microstrips that it is necessary to interconnect, it is possible to lengthen this microstrip and to act on the values $C_1$ and $C_2$, L and $Z_0$. This is why the invention provides that when two microstrips are coupled, the metallization that constitutes the microstrip of the upper level can be adapted at the surface, as shown for metallizations 8 and 10 of FIG. 1, in such a way as to form an adapted capacity.

The dielectric material that constitutes the insulating layer 12 is a mineral material such as silica $SiO_2$ or silicon nitride $Si_3N_4$. It can also be an organic material such as a polyimide that is sometimes presently used in the field of GaAs. The characteristics of this insulating material are essentially of having a dielectric constant that is compatible with the formation of capacities, taking into account the range of dimensions possible in function of the geometry of the microstrips and the capacity values in function of the operating frequencies.

Another advantage of this interconnection device consists in the protection of the surface of the chip during the storing of the plate substrates since by definition the pre-implanted circuits, like the pre-diffused circuits, are manufactured in advance and await being personalized for use. Due to the devices according to the invention, the insulating layer that protects the surface of the GaAs plate substrate is not pierced and the active elements remain effectively protected.

Figure 4:
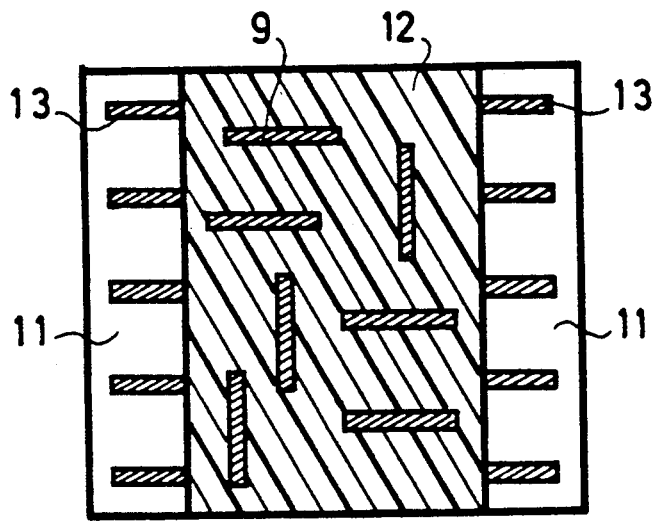
FIG. 4: upper view of a chip of the pre-implanted integrated circuit.

FIG. 4 shows an upper view of a chip of a pre-implanted integrated circuit according to the invention. The central part of this figure 4 allows to appear the insulating layer 12 that protects the network of the pre-implanted cells and, on this insulating layer 12, a plurality of metallic interconnections 9.

The feed network in direct current of the cells is distributed on the external part of the chip. On FIG. 4, the transistor supplies are represented on two edges of the chip, but the supplies distributed between one and four edges are also within the field of the invention. The insulating layer 12 is only deposited on the cell network, so that it leaves disengaged the periphery of the chip where electric contacts are seen to appear, supported by the semiconductor material 11. These electric contacts 13 correspond, for example, to the transistor supply, such as the supply of the source by a conductor 4 in FIG. 1. Among these electric contacts 13, certain can correspond to a grounding or other functions necessary to the circuit but which are not of the interconnection: for example, the input and the output of the circuit form part of the metallic contacts 13 taken on the edges of the chip of the pre-implanted network.

The hyperfrequency pre-implanted networks that are presently realized comprise a smaller number of interconnections than those made on silicon: 10 to 100 links between the cells is a representative value range of a hyperfrequency integrated circuit on GaAs or group III–V materials operating in frequency ranges located towards 8 to 10 GHz. It is known that in the field of hyperfrequencies, operating is limited to a minimum in the highest frequencies in order thereafter to drop back towards frequency divider devices or measurement devices that operate at lower frequencies and can, themselves, comprise much more complex circuits on silicon and comprising a much greater number of active cells.

The invention has application in all very high frequency parts, telecommunication materials, Hertz beams, emitting or receiving active radar heads, as specified in the following claims.

What is claimed is:

1. Interconnection device between the cells of a hyperfrequency integrated circuit pre-implanted in a semiconductor material, the cells being formed of active and passive components which comprise metallizations on the upper surface of the chip of semiconductor material, wherein the coupling between the component of a first cell and a component of a second cell is capacitive, said device comprising:

at least one microstrip in ohmic contact with a metallization of said first cell component and at least one microstrip in ohmic contact with a metallization of said second cell component, said microstrips being supported by the upper surface of said semiconductor material;

at least one insulating layer, deposited on the upper surface of the semiconductor material and said microstrips which supports said material;

at least one microstrip line supported by said insulating layer, said microstrip line partially covering the said microstrips supported by said semiconductor material in order to form a capacitive linking.

2. Interconnection device according to claim 1, wherein said microstrips supported by the semiconductor material have a length smaller than or equal to $\lambda/4$, $\lambda$ being the wavelength at the operating frequency of the pre-implanted circuit.

3. Interconnection device according to claim 1, wherein the material of the insulating layer is chosen from among $SiO_2$, $Si_3N_4$ or a polyimide.

4. Interconnection device according to claim 1, wherein the insulating layer covers the network of cells, and leaves exposed bare at least one lateral strip of the chip of the pre-implanted integrated circuit, on which appear the supply and the input-output metallizations of the integrated circuit.

5. Interconnection device according to claim 1 wherein:

said at least one microstrip of said first cell component as an electrical length $L_1$;

wherein said at least one microstrip of said second cell component is connected with said at least one microstrip of said first cell component and wherein the electrical length of said at least one microstrip of said second component is $L_2$;

said at least one microstrip line supported by said insulation layer has an electrical length L and a characteristic impedance $Z_0$;

and wherein tuning of said interconnection device is controlled by the values $L_1$, $L_2$, L of said electrical lengths of said microstrips and said microstrip line, the value $Z_0$ of said microstrip line supported by said insulating layer and the values $C_1$ and $C_2$ of the capacities formed by said first cell microstrip and said microstrip line supported by the insulating layer and by said second cell microstrip and the microstrip line supported by said insulating layer, respectively.

6. The interconnection device according to claim 5 wherein the impedance of said circuit is determined by the location of a point P where said at least one microstrip line supported by the insulation layer covers one of said at least one microstrip of said first cell and said second cell component.

7. Interconnection device according to claim 5 wherein when said at least one microstrip line supported by the insulating layer has a length longer than the distance separating said first cell microstrip and said second cell microstrip which is to be interconnected, said microstrip line on said insulating layer is folded over on the surface of said insulating layer.

8. The interconnection device according to claim 5 wherein said microstrip line supported by said insulating layer is shorter than the distance separating said first and second cell microstrips to be interconnected, than said microstrip line on said insulation layer is extended to a sufficient length to provide the interconnection of said first cell and second cell microstrip and wherein said circuit is tuned by means of said characteristic impedance $Z_0$ and said two coupling capacities $C_1$, $C_2$.

9. The interconnection device according to claim 5 wherein one end of said microstrip line supported by said insulating layer covers one of said first and second cell microstrip supported by said semiconductor material and forms with said one of said first and second cell microstrip a capacitance of a determined value.

10. An interconnection device between the cells of a hyperfrequency integrated circuit pre-implanted in a semiconductor material, the cells being formed of active and passive components which comprise metallizations on the upper surface of the chip of the semiconductor material, wherein the coupling between a component of a first cell and a component of a second cell is magnetic, said device comprising:

at least one microstrip in ohmic contact with a metallization of said first cell component and at least one microstrip in ohmic contact with a metallization of said second cell component, said microstrips being supported by the upper surface of the semiconductor material;

at least one insulating layer, deposited on the upper surface of said semiconductor material and said microstrips which said material supports;

at least one microstrip line supported by said insulating layer, said microstrip line being coupled with the said first and second cell microstrips, in order to form a magnetic coupling.

* * * * *